United States Patent
Kim

(10) Patent No.: US 10,916,608 B2
(45) Date of Patent: Feb. 9, 2021

(54) FLEXIBLE ORGANIC LIGHT EMITTING DISPLAY DEVICE HAVING A BLOCK STRUCTURE

(71) Applicant: SAMSUNG DISPLAY CO., LTD., Yongin-si (KR)

(72) Inventor: Namjin Kim, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/244,761

(22) Filed: Jan. 10, 2019

(65) Prior Publication Data

US 2019/0214587 A1    Jul. 11, 2019

(30) Foreign Application Priority Data

Jan. 11, 2018  (KR) .................. 10-2018-0003923

(51) Int. Cl.
*H01L 27/32* (2006.01)
*H01L 51/00* (2006.01)
(Continued)

(52) U.S. Cl.
CPC .......... *H01L 27/3258* (2013.01); *G09F 9/301* (2013.01); *H01L 27/3246* (2013.01); *H01L 27/3276* (2013.01); *H01L 51/0097* (2013.01); *H01L 51/5012* (2013.01); *H01L 51/5206* (2013.01); *H01L 51/5221* (2013.01); *H01L 51/5256* (2013.01); *H01L 27/322* (2013.01)

(58) Field of Classification Search
CPC ............. H01L 51/0097; H01L 51/5256; H01L 51/5012; H01L 51/5206; H01L 51/5221; H01L 51/5253; H01L 27/3246; H01L 27/3276; H01L 27/322; H01L 27/3258; H01L 27/3277; G09F 9/301
See application file for complete search history.

(56) References Cited

U.S. PATENT DOCUMENTS

2015/0041772 A1* 2/2015 Han ................ H01L 51/525
                                                    257/40
2017/0077447 A1  3/2017 Kang et al.
(Continued)

FOREIGN PATENT DOCUMENTS

KR    1020160097449    8/2016
KR    1020160136518    11/2016
(Continued)

*Primary Examiner* — Laura M Menz
*Assistant Examiner* — Candice Chan
(74) *Attorney, Agent, or Firm* — F. Chau & Associates, LLC

(57) ABSTRACT

An organic light emitting display (OLED) device includes a substrate having a display region and a peripheral region at least partially surrounding the display region. An insulating layer structure is disposed on the substrate within both the display region and the peripheral region. The insulating layer structure includes a groove in the peripheral region. A plurality of pixel structures is disposed in the display region on the insulating layer structure. A block structure is disposed in the peripheral region so as to at least partially overlap the groove of the insulating layer structure. The block structure at least partially fills the groove of the insulating layer structure.

17 Claims, 11 Drawing Sheets

(51) Int. Cl.
  *H01L 51/52* (2006.01)
  *H01L 51/50* (2006.01)
  *G09F 9/30* (2006.01)

(56) References Cited

U.S. PATENT DOCUMENTS

2017/0141352 A1\* 5/2017 Shin .................... H01L 27/3276
2017/0288004 A1\* 10/2017 Kim .................... H01L 27/3276

FOREIGN PATENT DOCUMENTS

KR  1020170057911  5/2017
KR  1020170080224  7/2017

\* cited by examiner

FLEXIBLE ORGANIC LIGHT EMITTING DISPLAY DEVICE HAVING A BLOCK STRUCTURE

CROSS-REFERENCE TO RELATED APPLICATION(S)

This application claims priority under 35 USC § 119 to Korean Patent Applications No. 10-2018-0003923, filed on Jan. 11, 2018 in the Korean Intellectual Property Office (KIPO), the contents of which are incorporated by reference herein in its entirety.

TECHNICAL FIELD

The present disclosure relates to a display device and, more particularly, to a flexible organic light emitting display device.

DISCUSSION OF THE RELATED ART

A flat panel display (FPD) device is widely used on account of its light weight and thin profile as compared to conventional display devices such as cathode-ray tube (CRT) display devices. Typical examples of FPD devices include a liquid crystal display (LCD) device and an organic light emitting display (OLED) device.

Recently, flexible OLED devices capable of being bent or folded have been developed. These flexible OLED devices may include lower and upper substrates made of flexible materials. For example, the lower substrate may include a flexible substrate, and the upper substrate may have a thin film encapsulation (TFE) structure. Here, the TFE structure may include an inorganic layer and an organic layer that are alternately stacked. A block structure may be disposed beyond (e.g., outside of) the flexible OLED device so as to prevent (or block) a reflow (or leakage) of the organic layer. Meanwhile, as a dead space (e.g., a peripheral region) of the flexible OLED device becomes slimmer (or smaller), a size (e.g., a width) of elements (e.g., the block structure) disposed in the dead space may be reduced. In this case, since a contact surface is reduced in a lower surface of the block structure having a relatively reduced width, a contact failure of the block structure may occur, and thus a defect of the flexible OLED device may occur.

SUMMARY

An organic light emitting display (OLED) device includes a substrate having a display region and a peripheral region at least partially surrounding the display region. An insulating layer structure is disposed on the substrate within both the display region and the peripheral region. The insulating layer structure includes a groove in the peripheral region. A plurality of pixel structures is disposed in the display region on the insulating layer structure. A block structure is disposed in the peripheral region so as to at least partially overlap the groove of the insulating layer structure. The block structure at least partially fills the groove of the insulating layer structure.

An OLED device includes a substrate having a display region including a plurality of pixel regions and a peripheral region at least partially surrounding the display region. An insulating layer structure is disposed on the substrate. The insulating layer structure has an opening in the peripheral region. A plurality of pixel structures is disposed in the pixel region on the insulating layer structure. A block structure is disposed in the peripheral region to at least partially overlap the opening of the insulating layer structure. The block structure at least partially fills the opening of the insulating layer structure. A shock absorbing structure is disposed in the peripheral region on the substrate. The shock absorbing structure is spaced apart from the block structure, the shock absorbing structure having a plurality of concave and convex patterns.

An OLED device includes a substrate having a display region including a plurality of pixel regions and a peripheral region at least partially surrounding the display region. An insulating layer structure is disposed on the substrate. The insulating layer structure has a plurality of grooves disposed in the peripheral region. A plurality of pixel structures is disposed in the pixel region on the insulating layer structure. A block structure is disposed in the peripheral region to at least partially overlap the grooves of the insulating layer structure. The block structure at least partially fills the grooves of the insulating layer structure. A shock absorbing structure is disposed in the peripheral region on the substrate. The shock absorbing structure is spaced apart from the block structure. The shock absorbing structure has a plurality of concave and convex patterns.

BRIEF DESCRIPTION OF THE DRAWINGS

A more complete appreciation of the present disclosure and many of the attendant aspects thereof will be readily obtained as the same becomes better understood by reference to the following detailed description taken in conjunction with the accompanying drawings, in which.

DETAILED DESCRIPTION OF THE EMBODIMENTS

Hereinafter, embodiments of the present inventive concept will be explained in detail with reference to the accompanying drawings. In describing exemplary embodiments of the present disclosure, specific terminology is employed for sake of clarity. However, the present disclosure is not intended to be limited to the specific terminology so selected, and it is to be understood that each specific element includes all technical equivalents which operate in a similar manner.

Figure 1:
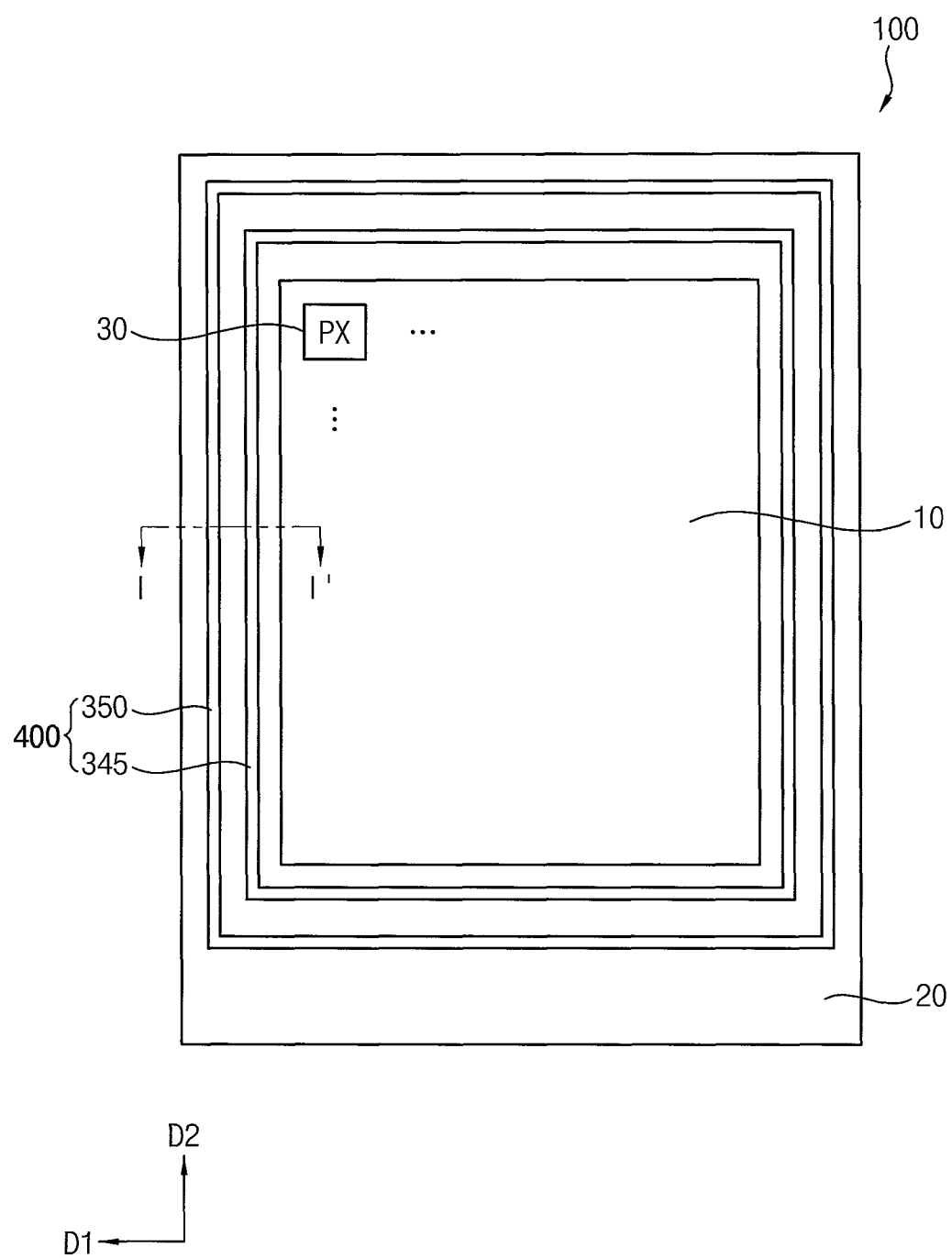
FIG. 1 is a plan view illustrating an organic light emitting display (OLED) device in accordance with exemplary embodiments of the present disclosure.
Figure 2:
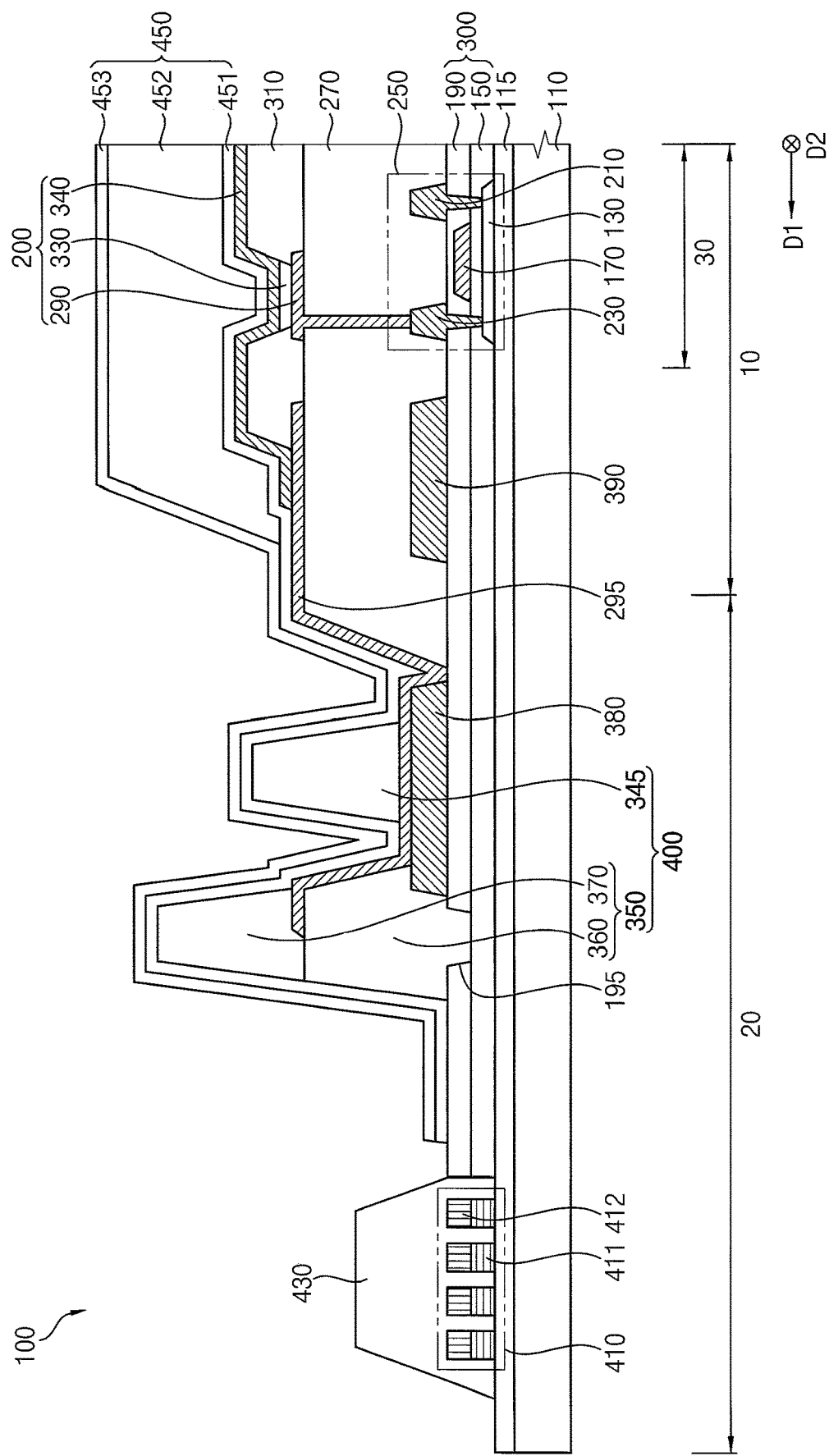
FIG. 2 is a cross-sectional view taken along a line I-I' of FIG. 1.

FIG. 1 is a plan view illustrating an organic light emitting display (OLED) device in accordance with exemplary embodiments of the present disclosure, and FIG. 2 is a cross-sectional view taken along a line I-I' of FIG. 1.

Referring to FIGS. 1 and 2, an organic light emitting display (OLED) device 100 may have a display region 10 and a peripheral region 20. Here, the display region 10 may include a plurality of pixel regions 30.

Pixel structures PX (e.g., a pixel structure 200 of FIG. 2) may be disposed in the display region 10. A display image may be displayed in the display region 10 through the pixel structure PX. Wirings (e.g., scan wirings, data wirings, power supply voltage wirings, etc.) and a block structure 400 may be disposed in the peripheral region 20. Here, the wirings may be electrically connected to the pixel structure PX, and the block structure 400 may include a first block pattern 345 and a second block pattern 350.

According to exemplary embodiments of the present disclosure, the first block pattern 345 may be disposed in the peripheral region 20 that is adjacent to a boundary of the display region 10 and the peripheral region 20, and the first block pattern 345 may at least partially surround the pixel structures PX. The second block pattern 350 may at least partially surround the first block pattern 345. A height of the second block pattern 350 may be greater than a height of the first block pattern 345. For example, the first block pattern 345 might not be in contact with the second block pattern 350, and they may be parallel to each other. The block structure 400 may prevent a leakage of a second thin film encapsulation (TFE) layer included in a TFE structure. In addition, as the OLED device 100 includes a flexible substrate and the TFE structure, the OLED device 100 may serve as a flexible OLED device.

A shape of each of the display and peripheral regions 10 and 20 illustrated in FIG. 1 may have a plan shape that is substantially square (or substantially rectangular), but other shapes may be used. For example, each of the display and peripheral regions 10 and 20 may be substantially triangular, substantially diamond shaped, substantially polygonal, substantially circular, substantially stadium shaped or oval shaped, or substantially elliptical.

FIG. 2 is a cross-sectional view taken along a line I-I' of FIG. 1.

Referring to FIG. 2, an OLED device 100 may include a substrate 110, a buffer layer 115, a semiconductor element 250, an insulating layer structure 300, a shock absorbing structure 410, a first power supply voltage wiring 380, a second power supply voltage wiring 390, a planarization layer 270, a protective insulation layer 430, a block structure 400, a pixel structure 200, a connection pattern 295, a pixel defining layer 310, a TFE structure 450, etc. Here, the pixel structure 200 may include a lower electrode 290, a light emitting layer 330, and an upper electrode 340. The semiconductor element 250 may include an active layer 130, a gate electrode 170, a source electrode 210, and a drain electrode 230. In addition, the TFE structure 450 may include a first TFE layer 451, a second TFE layer 452, and a third TFE layer 453. The shock absorbing structure 410 may include a first set of concave and convex patterns 411 and a second set of concave and convex patterns 412. Further, the insulating layer structure 300 may include a gate insulation layer 150 and an insulating interlayer 190. The block structure 400 may include a first block pattern 345 and a second block pattern 350. Here, the second block pattern 350 may include a first sub-block pattern 360 and a second sub-block pattern 370.

As described above, the OLED device 100 may include a display region 10 including a plurality of pixel regions 30 and a peripheral region 20 surrounding the display region 10. A display image may be displayed in the display region 10 through the pixel structure 200. The block structure 400, the shock absorbing structure 410, wirings, etc. may be disposed in the peripheral region 20 (e.g., non-display region). A plurality of transistors, a plurality of capacitors, a plurality of wirings, etc. may be further disposed in the display region 10. As the OLED device 100 includes a flexible substrate 110 and the TFE structure 450, the OLED device 100 may serve as a flexible OLED device.

The substrate 110 having opaque or transparent materials may be provided. The substrate 110 may include a flexible transparent resin substrate. According to some exemplary embodiments of the present disclosure, the substrate 110 may have a configuration where a first organic layer, a first barrier layer, a second organic layer, and a second barrier layer are sequentially stacked. The first barrier layer and the second barrier layer may each include inorganic materials such as silicon oxide, etc. In addition, the first organic layer and the second organic layer may each include organic materials such as a polyamide-based resin. According to exemplary embodiments of the present disclosure, each of the first and second barrier layers may block moisture or water that may permeate through the first and second organic layers.

Since the substrate 110 is relatively thin and flexible, the substrate 110 may be disposed on a rigid glass substrate, during fabrication, to help support the formation of the semiconductor element 250 and the pixel structure 200. In a manufacturing the OLED device 100, after the buffer layer 115 is disposed on the second barrier layer of the substrate 110, the semiconductor element 250 and the pixel structure 200 may be disposed on the buffer layer 115. After the semiconductor element 250 and the pixel structure 200 are formed on the insulation layer, the rigid glass substrate on which the substrate 110 is disposed may be removed. It may be difficult to directly form the semiconductor element 250 and the pixel structure 200 on the substrate 110 because of the thinness and flexibility of the substrate 110. Accordingly, the semiconductor element 250 and the pixel structure 200 are formed on the substrate 110 and the rigid glass substrate, and then the substrate 110 including the first organic layer, the first barrier layer, the second organic layer, and the second barrier layer may serve as the substrate 110 of the OLED device 100 after the removal of the rigid glass substrate. Alternatively, the substrate 110 may include a quartz substrate, a synthetic quartz substrate, a calcium fluoride substrate, a fluoride-doped quartz substrate, a sodalime glass substrate, a non-alkali glass substrate etc.

According to exemplary embodiments of the present disclosure, the substrate 110 includes four-layers, but another number of layers may alternatively be used. For example, in some exemplary embodiments of the present disclosure, the substrate 110 may include a single layer or a plurality of layers.

As the OLED device 100 may have the pixel region 30 and the peripheral region 20 and the substrate 110 may be divided into the pixel region 30 and the peripheral region 20.

The buffer layer 115 may be disposed on the substrate 110. The buffer layer 115 may cover the entire substrate 110. The buffer layer 115 may prevent the diffusion of metal atoms and/or impurities from the substrate 110 into the semiconductor element 250 and the pixel structure 200. In addition, the buffer layer 115 may control a rate of a heat transfer in a crystallization process for forming the active layer 130, thereby leading to the production of a substantially uniform active layer. Further, the buffer layer 115 may increase a surface flatness of the substrate 110 when a surface of the substrate 110 is relatively irregular. According to a type of the substrate 110, at least two buffer layers 115 may be disposed on the substrate 110, or the buffer layer 115 may be omitted. For example, the buffer layer 115 may include organic materials or inorganic materials. In exemplary embodiments of the present disclosure, the buffer layer 115 may include the organic materials.

The active layer 130 may be disposed in the pixel region 30 on the substrate 110. The active layer 130 may include an oxide semiconductor, an inorganic semiconductor (e.g., amorphous silicon, polysilicon, etc.), an organic semiconductor, etc.

The gate insulation layer 150 may be disposed on the buffer layer 115 and the active layer 130. The gate insulation layer 150 may at least partially cover the active layer 130 in the display region 10 on the buffer layer 115, and may extend into the peripheral region 20 along a first direction D1 (e.g., a direction from the display region 10 into the peripheral region 20 of FIG. 2). In exemplary embodiments of the present disclosure, the gate insulation layer 150 might not be disposed at the outermost portion of the OLED device 100. For example, the gate insulation layer 150 may expose an upper surface of the buffer layer 115 that is located at the outermost portion of the OLED device 100, and a distal end portion of the gate insulation layer 150 that is located in the peripheral region 20 may be spaced apart from the shock absorbing structure 410. The gate insulation layer 150 may at least partially cover the active layer 130 on the buffer layer 115, and may have a substantially flat upper surface without a step around the active layer 130. Alternatively, the gate insulation layer 150 may at least partially cover the active layer 130 on the buffer layer 115, and may be disposed with a substantially uniform thickness along a profile of the active layer 130. The gate insulation layer 150 may include a silicon compound, metal oxide, etc.

The gate electrode 170 may be disposed in the pixel region 30 on the gate insulation layer 150. For example, the gate electrode 170 may be disposed on a portion of the gate insulation layer 150 under which the active layer 130 is located. The gate electrode 170 may include a metal, a metal alloy, metal nitride, conductive metal oxide, transparent conductive materials, etc. For example, the gate electrode 170 may be formed of gold (Au), an alloy of Au, silver (Ag), an alloy of Ag, aluminum (Al), an alloy of Al, platinum (Pt), an alloy of Pt, nickel (Ni), titanium (Ti), palladium (Pd), magnesium (Mg), calcium (Ca), Lithium (Li), chromium (Cr), an alloy of Cr, tantalum (Ta), tungsten (W), copper (Cu), an alloy of Cu, molybdenum (Mo), an alloy of Mo, scandium (Sc), neodymium (Nd), iridium (Ir), aluminum nitride (AlNx), titanium nitride (TiNx), chromium nitride (CrNx), tantalum nitride (TaNx), tungsten nitride (WNx), strontium ruthenium oxide (SRO), zinc oxide (ZnOx), stannum oxide (SnOx), indium oxide (InOx), gallium oxide (GaOx), indium tin oxide (ITO), indium zinc oxide (IZO), etc. These may be used alone or in a suitable combination thereof. Alternatively, the gate electrode 170 may have a multi-layered structure including a plurality of layers.

The insulating interlayer 190 may be disposed on the gate insulation layer 150 and the gate electrode 170. The insulating interlayer 190 may at least partially cover the gate electrode 170 in the display region 10 on the gate insulation layer 150, and may extend into the peripheral region 20 along the first direction D1. In exemplary embodiments of the present disclosure, the insulating interlayer 190 may have an opening 195 exposing an upper surface of the gate insulation layer 150 in the peripheral region 20. For example, the opening 195 may correspond to a groove of the insulating layer structure 300. The opening 195 may at least partially overlap the second block pattern 350. In addition, the insulating interlayer 190 might not be disposed at the outermost portion of the OLED device 100. For example, the insulating interlayer 190 may expose the upper surface of the buffer layer 115 that is located at the outermost portion of the OLED device 100, and a distal end portion of the insulating interlayer 190 that is located in the peripheral region 20 may be spaced apart from the shock absorbing structure 410. The insulating interlayer 190 may at least partially cover the gate electrode 170 on the gate insulation layer 150, and may have a substantially flat upper surface without a step around the gate electrode 170. Alternatively, the insulating interlayer 190 may at least partially cover the gate electrode 170 on the gate insulation layer 150, and may be disposed with a substantially uniform thickness along a profile of the gate electrode 170. The insulating interlayer 190 may include silicon compound, metal oxide, etc. Accordingly, the insulating layer structure 300 including the gate insulation layer 150 and the insulating interlayer 190 may be fabricated. In some exemplary embodiments of the present disclosure, the insulating interlayer 190 may have a groove where at least a portion of the insulating interlayer 190 is removed in the peripheral region 20. For example, the groove may at least partially overlap the second block pattern 350, and the first sub-block pattern 360 of the second block pattern 350 may at least partially fill the groove.

The shock absorbing structure 410 may be disposed in the peripheral region 20 on the buffer layer 115. In exemplary embodiments of the present disclosure, the shock absorbing structure 410 may be located at the outermost portion of the OLED device 100, and may be spaced apart from the insulating layer structure 300 in the first direction D1. In addition, the shock absorbing structure 410 and the insulating layer structure 300 may be located within the same layer, and the shock absorbing structure 410 may have a plurality of concave and convex patterns. For example, the shock absorbing structure 410 may include first concave and convex patterns 411 and second concave and convex patterns 412. The first concave and convex patterns 411 may be disposed on the buffer layer 115, and may be spaced apart from each other. The second concave and convex patterns 412 may be disposed on the first concave and convex patterns 411, and may at least partially overlap the first concave and convex patterns 411. Here, the first concave and convex patterns 411 and the gate insulation layer 150 may be located within the same layer, and may be simultaneously (or concurrently) formed from substantially the same materials. The second concave and convex patterns 412 and the insulating interlayer 190 may be located within the same layer, and may be simultaneously formed from substantially the same materials. The shock absorbing structure 410 may include silicon compound, metal oxide, etc. For example, the shock absorbing structure 410 may be formed of silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc.

For example, when an external impact occurs in the outermost portion of the OLED device 100, the amount of the external impact capable of being transmitted to the insulating layer structure 300 may be reduced by the shock absorbing structure 410 because the shock absorbing structure 410 includes the plurality of concave and convex patterns that are spaced apart from each other and because the shock absorbing structure 410 is spaced apart from the insulating layer structure 300. For example, the shock absorbing structure 410 may absorb a portion of the external impact. Accordingly, as the OLED device 100 includes the shock absorbing structure 410, the OLED device 100 may protect the semiconductor element 250, the pixel structure 200, and the TFE structure 450, etc. from the external impact.

The source electrode 210 and the drain electrode 230 may be disposed in the pixel region 30 on the insulating interlayer 190. The source electrode 210 may be in contact with a first side (e.g., a source region) of the active layer 130 via a contact hole formed by removing a first portion of the gate insulation layer 150 and the insulating interlayer 190. The drain electrode 230 may be in contact with a second side (e.g., a drain region) of the active layer 130 via a contact hole formed by removing a second portion of the gate insulation layer 150 and the insulating interlayer 190. Each of the source electrode 210 and the drain electrode 230 may include a metal, an alloy, metal nitride, conductive metal oxide, transparent conductive materials, etc. These may be used alone or in a suitable combination thereof. Alternatively, each of the source electrode 210 and the drain electrode 230 may have a multi-layered structure including a plurality of layers. Accordingly, the semiconductor element 250 including the active layer 130, the gate electrode 170, the source electrode 210, and the drain electrode 230 may be fabricated.

In exemplary embodiments of the present disclosure, the OLED device 100 includes one transistor (e.g., the semiconductor element 250), but additional transistors may also be included. For example, in some exemplary embodiments of the present disclosure, the OLED device 100 may include at least two transistors and at least one capacitor.

In addition, a configuration of the semiconductor element 250 includes the active layer 130, the gate electrode 170, the source electrode 210, and the drain electrode 230, but other configurations may be used. For example, the semiconductor element 250 may have a configuration including the active layer 130, the gate insulation layer 150, the gate electrode 170, the insulating interlayer 190, the source electrode 210, and the drain electrode 230.

Further, in exemplary embodiments of the present disclosure, the semiconductor element 250 has a top gate structure, but other structures may be used. For example, in some exemplary embodiments of the present disclosure, the semiconductor element 250 may have a bottom gate structure and/or a double gate structure.

The first power supply voltage wiring 380 may be disposed in the peripheral region 20 on the insulating layer structure 300. In exemplary embodiments of the present disclosure, the first power supply voltage wiring 380 may be located adjacent to a boundary of the display region 10 and the peripheral region 20, and may extend in a second direction D2 that is perpendicular to the first direction D1. In addition, the first power supply voltage wiring 380 might not overlap the opening 195 of the insulating interlayer 190, and a low power supply voltage may be provided in the first power supply voltage wiring 380. Here, the low power supply voltage may be applied to the upper electrode 340. For example, the first power supply voltage wiring 380 may include a metal, an alloy of a metal, metal nitride, conductive metal oxide, transparent conductive materials, etc. These may be used alone or in a suitable combination thereof. Alternatively, the first power supply voltage wiring 380 may have a multi-layered structure including a plurality of layers.

The second power supply voltage wiring 390 may be disposed in the display region 10 on the insulating layer structure 300. In exemplary embodiments of the present disclosure, the second power supply voltage wiring 390 may be located adjacent to a boundary of the display region 10 and the peripheral region 20, and may be disposed between the first power supply voltage wiring 380 and the drain electrode 230 on the insulating layer structure 300. In addition, the second power supply voltage wiring 390 may extend in the second direction D2, and a high power supply voltage, which has a higher voltage level than the low power supply voltage, may be provided in the second power supply voltage wiring 390. Here, the high power supply voltage may be applied to the lower electrode 290. For example, the second power supply voltage wiring 390 may include a metal, an alloy of a metal, metal nitride, conductive metal oxide, transparent conductive materials, etc. These may be used alone or in a suitable combination thereof. Alternatively, the second power supply voltage wiring 390 may have a multi-layered structure including a plurality of layers.

In exemplary embodiments of the present disclosure, the first power supply voltage wiring 380, the second power supply voltage wiring 390, the source electrode 210, and the drain electrode 230 may be located within the same layer, and may be simultaneously formed from substantially the same materials. In some exemplary embodiments of the present disclosure, the OLED device 100 may further include a plurality of wiring patterns in the display region 10. For example, the wiring patterns may be disposed between the first power supply voltage wiring 380 and the drain electrode 230.

The planarization layer 270 may be disposed on the insulating layer structure 300, the second power supply voltage wiring 390, the source electrode 210, and the drain electrode 230, and might not overlap the first power supply voltage wiring 380. The planarization layer 270 may be disposed as a high thickness to at least partially cover the second power supply voltage wiring 390 and the source and drain electrodes 210 and 230 on the insulating interlayer 190. In this case, the planarization layer 270 may have a substantially flat upper surface, and a planarization process may be further performed on the planarization layer 270 to implement the flat upper surface of the planarization layer 270. In addition, the planarization layer 270 may have a contact hole exposing an upper surface of the drain electrode 230. The planarization layer 270 may include organic materials or inorganic materials. In exemplary embodiments of the present disclosure, the planarization layer 270 may include organic materials.

The first sub-block pattern 360 may be disposed in the peripheral region 20 on the insulating layer structure 300. In exemplary embodiments of the present disclosure, the first sub-block pattern 360 may at least partially fill the opening 195 of the insulating interlayer 190, and may be in direct contact with an upper surface of the gate insulation layer 150. The first sub-block pattern 360 may at least partially overlap a portion of the first power supply voltage wiring 380. In addition, the first sub-block pattern 360 may block a leakage of the second TFE layer 452, and the first sub-block pattern 360 and the planarization layer 270 may be located within the same layer. The first sub-block pattern 360 may include organic materials or inorganic materials. In exemplary embodiments of the present disclosure, the first sub-block pattern 360 may include the organic materials such as polyimide, epoxy-based resin, acryl-based resin, polyester, photoresist, polyacryl-based resin, polyimide-based resin, a polyamide-based resin, a siloxane-based resin, etc.

For example, as an OLED device becomes slimmer, a width of the peripheral region of the OLED device may be reduced. Thus, a width of each of a shock absorbing structure, a block structure, a first power supply voltage wiring, etc. that are located in the peripheral region 20 may be also reduced. Here, as a width of a second block pattern is reduced, a contact area where an upper surface of an insulating interlayer of the insulating layer structure is in contact with a lower surface of the second block pattern may be reduced. In this case, the second block pattern may be separated from the insulating interlayer due to a relatively low adhesive strength between the second block pattern and the insulating interlayer, and a defect of the OLED device may occur.

In exemplary embodiments of the present disclosure, as the insulating interlayer 190 includes the opening 195 of the insulating interlayer 190 (e.g., a groove of the insulating interlayer 190), a contact area of the second block pattern 350 may be relatively increased by the opening 195. Accordingly, although a width of the second block pattern 350 is relatively reduced, a contact failure where the second block pattern 350 is separated from the insulating layer structure 300 might be prevented.

The protective insulation layer 430 may be disposed in the peripheral region 20 on the buffer layer 115 and the shock absorbing structure 410. The protective insulation layer 430 may at least partially overlap and cover the shock absorbing structure 410. In exemplary embodiments of the present disclosure, the protective insulation layer 430 may completely cover the shock absorbing structure 410.

For example, in a process for manufacturing the OLED device 100, after the shock absorbing structure 410 is formed, metal particles generated in a process for etching a metal layer formed on the substrate 110 (e.g., a process for forming the source electrode 210, the drain electrode 230, the first power supply voltage wiring 380, the second power supply voltage wiring 390, the lower electrode 290, the connection pattern 295, etc.) may make their way into an opening formed inside the shock absorbing structure 410 (e.g., a space formed between two adjacent the first concave and convex patterns 411). Here, when the protective insulation layer 430 is not formed on the shock absorbing structure 410, the metal particles may generate a defect in a subsequent process (e.g., a process for forming the light emitting layer 330). For example, the metal particles may escape from the opening formed inside the shock absorbing structure 410, and then the light emitting layer 330 may be formed with metal particles trapped therein. Thus, the metal particles may generate a defect of the light emitting layer 330. In exemplary embodiments of the present disclosure, as the protective insulation layer 430 is disposed on the shock absorbing structure 410, the OLED device 100 may prevent defects associated with the presence of the metal particles. For example, although metal particles generated in a process for forming the source electrode 210, the drain electrode 230, the first power supply voltage wiring 380, the second power supply voltage wiring 390, etc. is positioned in the opening formed inside the shock absorbing structure 410, the metal particles may be prevented from escaping because the protective insulation layer 430 covers the shock absorbing structure 410. In addition, as the protective insulation layer 430 covers the shock absorbing structure 410, metal particles generated in a process for forming the lower electrode 290, the connection pattern 295, etc. may be blocked from entering an opening formed inside the shock absorbing structure 410. Further, the protective insulation layer 430 together with the shock absorbing structure 410 may reduce an external impact generated in the outermost portion of the OLED device 100.

In exemplary embodiments of the present disclosure, the protective insulation layer 430 may include organic materials. In addition, the planarization layer 270, the first sub-block pattern 360, and the protective insulation layer 430 may be simultaneously formed from substantially the same materials.

The lower electrode 290 may be disposed in the pixel region 30 on the planarization layer 270. The lower electrode 290 may be in direct contact with the drain electrode 230 via the contact hole of the planarization layer 270, and may be electrically connected to the semiconductor element 250. The lower electrode 290 may include a metal, a metal alloy, metal nitride, conductive metal oxide, transparent conductive materials, etc. These may be used alone or in a suitable combination thereof. Alternatively, the lower electrode 290 may have a multi-layered structure including a plurality of layers.

The connection pattern 295 may be disposed on the planarization layer 270, the first power supply voltage wiring 380, and a portion of an upper surface of the first sub-block pattern 360. For example, the connection pattern 295 may be spaced apart from the lower electrode 290 on the planarization layer 270, and may extend in the first direction D1. The connection pattern 295 may be disposed in the display and peripheral regions 10 and 20, which are located adjacent to a boundary the display region 10 and the peripheral region 20, on the planarization layer 270. The connection pattern 295 may be interposed between the first block pattern 345 and the first power supply voltage wiring 380 in the peripheral region 20, and a portion of the connection pattern 295 may be interposed between the first sub-block pattern 360 and the second sub-block pattern 370. Alternatively, the connection pattern 295 might not be disposed on an upper surface of the first sub-block pattern 360.

The connection pattern 295 may electrically connect the first power supply voltage wiring 380 and the upper electrode 340, and may receive the low power supply voltage from the first power supply voltage wiring 380. In addition, the low power supply voltage may be applied to the upper electrode 340. The connection pattern 295 may include a metal, an alloy of a metal, metal nitride, conductive metal oxide, transparent conductive materials, etc. These may be used alone or in a suitable combination thereof. Alternatively, the connection pattern 295 may have a multi-layered structure including a plurality of layers. In exemplary embodiments of the present disclosure, the lower electrode 290 and the connection pattern 295 may be simultaneously formed from substantially the same materials.

The pixel defining layer 310 may be disposed on a portion of the lower electrode 290, a portion of the connection pattern 295, and the planarization layer 270. The pixel defining layer 310 may at least partially cover both lateral portions of the lower electrode 290, and may have an opening exposing a portion of an upper surface of the lower electrode 290. The pixel defining layer 310 may include organic materials or inorganic materials. In exemplary embodiments of the present disclosure, the pixel defining layer 310 may include the organic materials.

The light emitting layer 330 may be disposed on the lower electrode 290 exposed by the opening of the pixel defining layer 310. The light emitting layer 330 may be formed from light emitting materials capable of generating different colors of light (e.g., red, blue, and green, etc.) according to sub-pixels. Alternatively, the light emitting layer 330 may generate white light by stacking a plurality of light emitting materials capable of generating different colors of light such as red, green, blue, etc. In this case, a color filter may be disposed on the light emitting layer 330 (e.g., on an upper surface of the TFE structure 450 to at least partially overlap the light emitting layer 330). The color filter may include a red color filter, a green color filter, and/or a blue color filter. Alternatively, the color filter may include a yellow color filter, a cyan color filter, and/or a magenta color filter. The color filter may include a photosensitive resin (or color photoresist), etc.

The first block pattern 345 may be disposed in the peripheral region 20 on the connection pattern 295. For example, the first block pattern 345 may be disposed on the connection pattern 295 under which the first power supply voltage wiring 380 is located. As illustrated in FIG. 1, the first block pattern 345 may surround the display region 10. In exemplary embodiments of the present disclosure, the first block pattern 345 may block a leakage of the second TFE layer 452. The first block pattern 345 may include inorganic materials or organic materials. In exemplary embodiments of the present disclosure, the first block pattern 345 may include the organic materials.

The second sub-block pattern 370 may be disposed on the first sub-block pattern 360 and a portion of the connection pattern 295. In exemplary embodiments of the present disclosure, the second sub-block pattern 370 together with the first sub-block pattern 360 may block a leakage of the second TFE layer 452. In addition, the second sub-block pattern 370 may include organic materials. In exemplary embodiments of the present disclosure, the pixel defining layer 310, the first block pattern 345, and the second sub-block pattern 370 may be simultaneously formed from substantially the same materials.

Accordingly, the second block pattern 350 including the first sub-block pattern 360 and the second sub-block pattern 370 may be fabricated. As illustrated in FIG. 1, the second block pattern 350 may be spaced apart from the first block pattern 345 in the first direction D1, and the second block pattern 350 may surround the first block pattern 345. The second block pattern 350 may at least partially overlap the groove the insulating layer structure 300, and a height of the second block pattern 350 may be greater than a height of the first block pattern 345. In addition, the first block pattern 345 and the second block pattern 350 may be defined as the block structure 400.

The upper electrode 340 may be disposed on the pixel defining layer 310 and the light emitting layer 330. The upper electrode 340 may at least partially cover the light emitting layer 330 and the pixel defining layer 310, and may be disposed over the entire substrate 110. In exemplary embodiments of the present disclosure, the upper electrode 340 may at least partially cover the light emitting layer 330 and extend in the first direction D1, and may be electrically connected to the connection pattern 295 in the display region 10 that is located adjacent to a boundary of the display region 10 and the peripheral region 20. The upper electrode 340 may include a metal, a metal alloy, metal nitride, conductive metal oxide, transparent conductive materials, etc. These may be used alone or in a suitable combination thereof. Alternatively, the upper electrode 340 may have a multi-layered structure including a plurality of layers. Accordingly, the pixel structure 200 including the lower electrode 290, the light emitting layer 330, and the upper electrode 340 may be fabricated.

The first TFE layer 451 may be disposed on the upper electrode 340, the connection pattern 295, the block structure 400, the insulating interlayer 190, etc. The first TFE layer 451 may at least partially cover the upper electrode 340, the connection pattern 295, and the block structure 400, and may be disposed with a substantially uniform thickness along a profile of the upper electrode 340, the connection pattern 295, and the block structure 400. The first TFE layer 451 may block the permeation of moisture, water, oxygen, etc. which may deteriorate the pixel structure 200. In addition, the first TFE layer 451 may protect the pixel structure 200 from external impact. The first TFE layer 451 may include flexible inorganic materials.

The second TFE layer 452 may be disposed on the first TFE layer 451. The second TFE layer 452 may increase the flatness of the OLED device 100, and may protect the pixel structure 200. The second TFE layer 452 may include flexible organic materials.

The third TFE layer 453 may be disposed on the second TFE layer 452. The third TFE layer 453 may at least partially cover the second TFE layer 452, and may be disposed with a substantially uniform thickness along a profile of the second TFE layer 452. The third TFE layer 453 together with the first TFE layer 451 and the second TFE layer 452 may prevent the permeation of moisture, water, oxygen, etc. which may deteriorate the pixel structure 200. In addition, the third TFE layer 453 together with the first TFE layer 451 and the second TFE layer 452 may protect the pixel structure 200 from external impact. The third TFE layer 453 may include flexible inorganic materials. Accordingly, the TFE structure 450 including the first TFE layer 451, the second TFE layer 452, and the third TFE layer 453 may be fabricated.

Alternatively, the TFE structure 450 may have five layers structure where first through fifth TFE layers are stacked or seven layers structure where the first through seventh TFE layers are stacked.

As the OLED device 100 in accordance with exemplary embodiments of the present disclosure includes the insulating layer structure 300 having the groove (or the insulating interlayer 195 having the opening 195), a contact area of the second block pattern 350 may be relatively increased by the groove. Accordingly, although a width of the second block pattern 350 is relatively reduced, a contact failure where the second block pattern 350 is separated from the insulating layer structure 300 may be prevented.

FIGS. 3 through 8 are cross-sectional views illustrating a method of manufacturing an OLED device in accordance with exemplary embodiments of the present disclosure.

Figure 3:
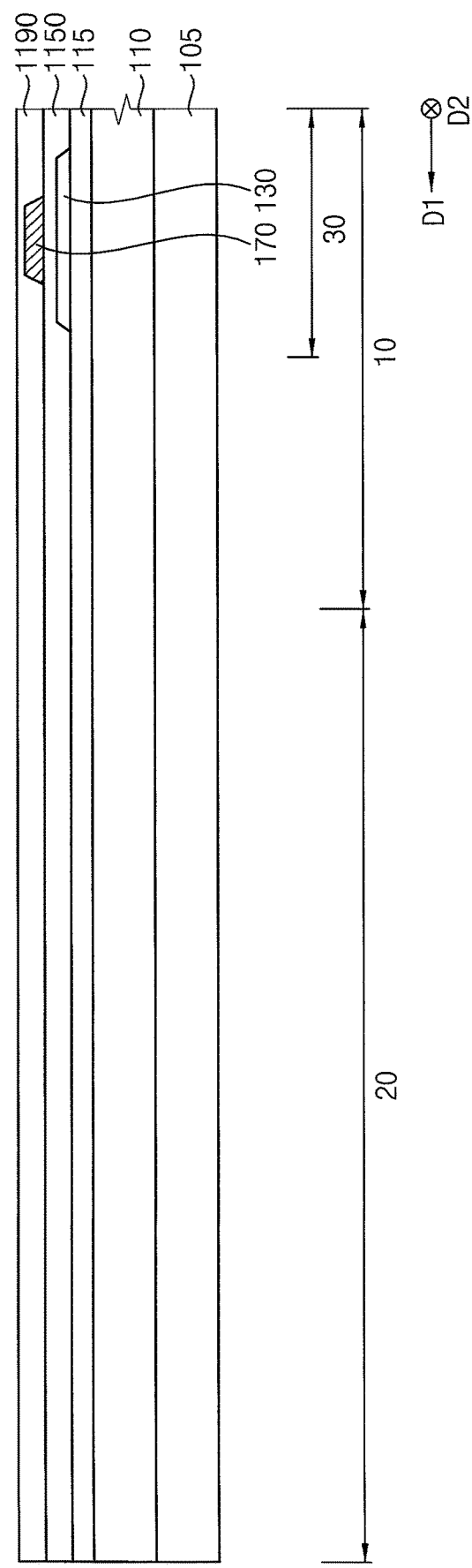
FIGS. 3 through 8 are cross-sectional views illustrating a method of manufacturing an OLED device in accordance with exemplary embodiments of the present disclosure.

Referring to FIG. 3, a rigid glass substrate 105 may be provided. A substrate 110 including transparent materials or opaque materials may be formed on the rigid glass substrate 105. The substrate 110 may be formed from a flexible transparent material such as a flexible transparent resin substrate. In exemplary embodiments of the present disclosure, the substrate 110 may have a structure in which a first organic layer, a first barrier film layer, a second organic layer, a second barrier film layer are sequentially stacked. The first and second barrier film layers may be formed from inorganic materials, and the first and second organic layers may be formed from organic materials. For example, each of the first and second barrier film layers may include silicon oxide, and may block water, moisture, etc. permeated through the first and second organic layers. Further, each of the first and second organic layers may include a polyimide-based resin.

Alternatively, the substrate 110 may be formed from a quartz substrate, a synthetic quartz substrate, a calcium fluoride substrate, a fluoride-doped quartz substrate, a sodalime glass substrate, a non-alkali glass substrate etc.

A buffer layer 115 may be formed on the substrate 110. The buffer layer 115 may be formed over the entire substrate 110. The buffer layer 115 may prevent the diffusion of metal atoms and/or impurities from the substrate 110. In addition, the buffer layer 115 may control a rate of a heat transfer in a crystallization process for forming the active layer, thereby obtaining substantially uniform active layer. Further, the buffer layer 115 may increase a surface flatness of the substrate 110 when a surface of the substrate 110 is relatively irregular. According to a type of the substrate 110, at least two buffer layers 115 may be disposed on the substrate 110, or the buffer layer 115 may be omitted. For example, the buffer layer 115 may be formed from silicon compound, metal oxide, etc.

An active layer 130 may be formed in a pixel region 30 on the substrate 110. The active layer 130 may be formed from an oxide semiconductor, an inorganic semiconductor (e.g., amorphous silicon, polysilicon, etc.), an organic semiconductor, etc.

A preliminary gate insulation layer 1150 may be formed on the buffer layer 115 and the active layer 130. The preliminary gate insulation layer 1150 may at least partially cover the active layer 130 in a display region 10 on the buffer layer 115, and may extend into a peripheral region 20 along a first direction D1. For example, the preliminary gate insulation layer 1150 may at least partially cover the active layer 130 on the buffer layer 115, and may have a substantially flat upper surface without a step around the active layer 130. Alternatively, the preliminary gate insulation layer 1150 may at least partially cover the active layer 130 on the buffer layer 115, and may be disposed with a substantially uniform thickness along a profile of the active layer 130. The preliminary gate insulation layer 1150 may be formed from silicon compound, metal oxide, etc. For example, the preliminary gate insulation layer 1150 may include SiOx, SiNx, SiOxNy, SiOxCy, SiCxNy, AlOx, AlNx, TaOx, HfOx, ZrOx, TiOx, etc.

The gate electrode 170 may be formed in the pixel region 30 on the preliminary gate insulation layer 1150. For example, the gate electrode 170 may be formed on a portion of the preliminary gate insulation layer 1150 under which the active layer 130 is located. The gate electrode 170 may be formed from a metal, a metal alloy, metal nitride, conductive metal oxide, transparent conductive materials, etc. For example, the gate electrode 170 may include Au, an alloy of Au, Ag, an alloy of Ag, Al, an alloy of Al, Pt, an alloy of Pt, Ni, Ti, Pd, Mg, Ca, Li, Cr, an alloy of Cr, Ta, W, Cu, an alloy of Cu, Mo, an alloy of Mo, Sc, Nd, Ir, AlNx, TiNx, CrNx, TaNx, WNx, SRO, ZnOx, SnOx, InOx, GaOx, ITO, IZO, etc. These may be used alone or in a suitable combination thereof. Alternatively, the gate electrode 170 may have a multi-layered structure including a plurality of layers.

A preliminary insulating interlayer 1190 may be formed on the preliminary gate insulation layer 1150 and the gate electrode 170. The preliminary insulating interlayer 1190 may at least partially cover the gate electrode 170 in the display region 10 on the preliminary gate insulation layer 1150, and may extend into the peripheral region 20 along the first direction D1. For example, the preliminary insulating interlayer 1190 may at least partially cover the gate electrode 170 on the preliminary gate insulation layer 1150, and may have a substantially flat upper surface without a step around the gate electrode 170. Alternatively, the preliminary insulating interlayer 1190 may at least partially cover the gate electrode 170 on the preliminary gate insulation layer 1150, and may be formed with a substantially uniform thickness along a profile of the gate electrode 170. The insulating interlayer 190 may include silicon compound, metal oxide, etc.

Figure 4:
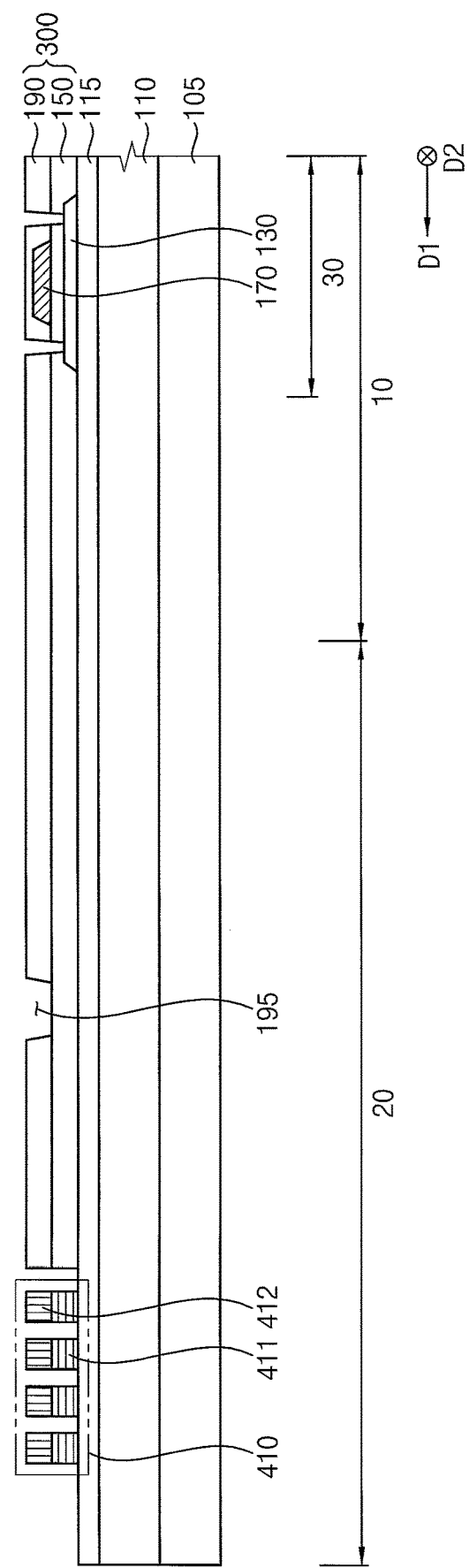
Figure 5:
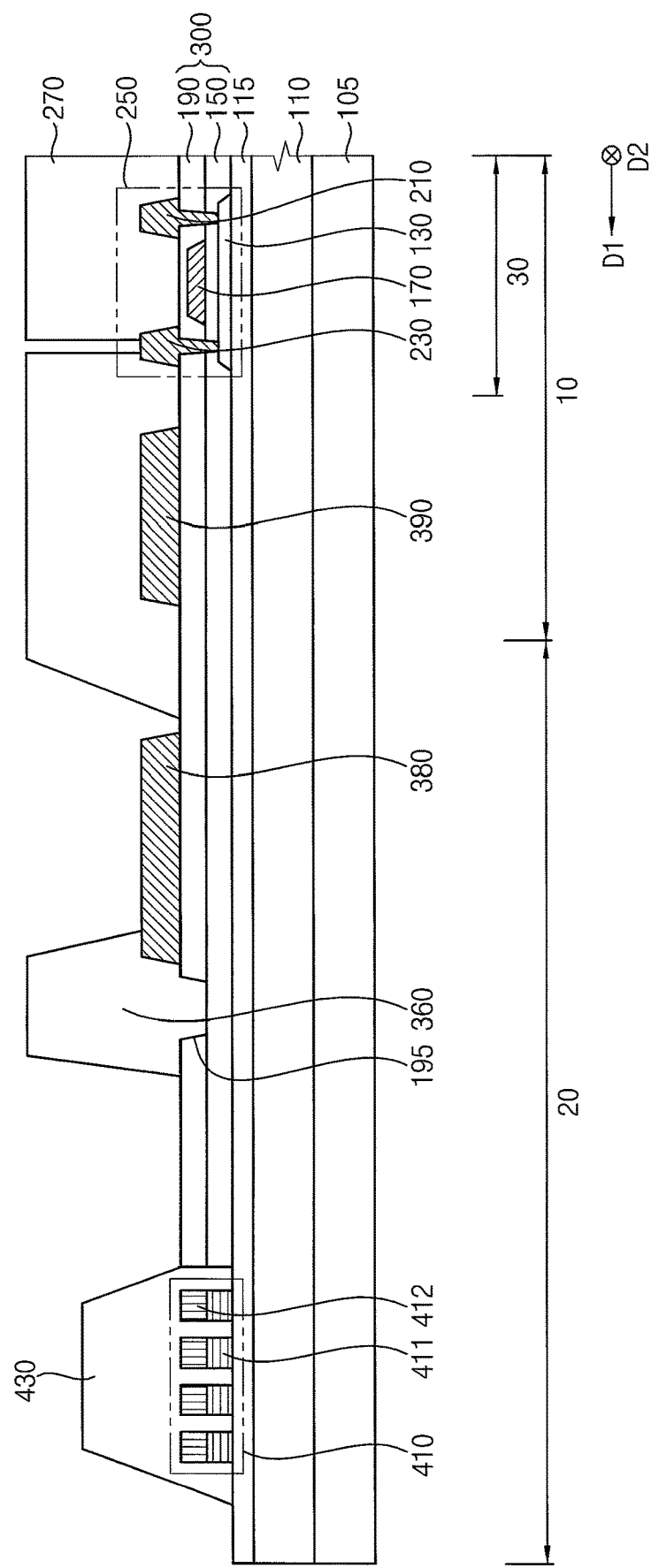
Figure 6:
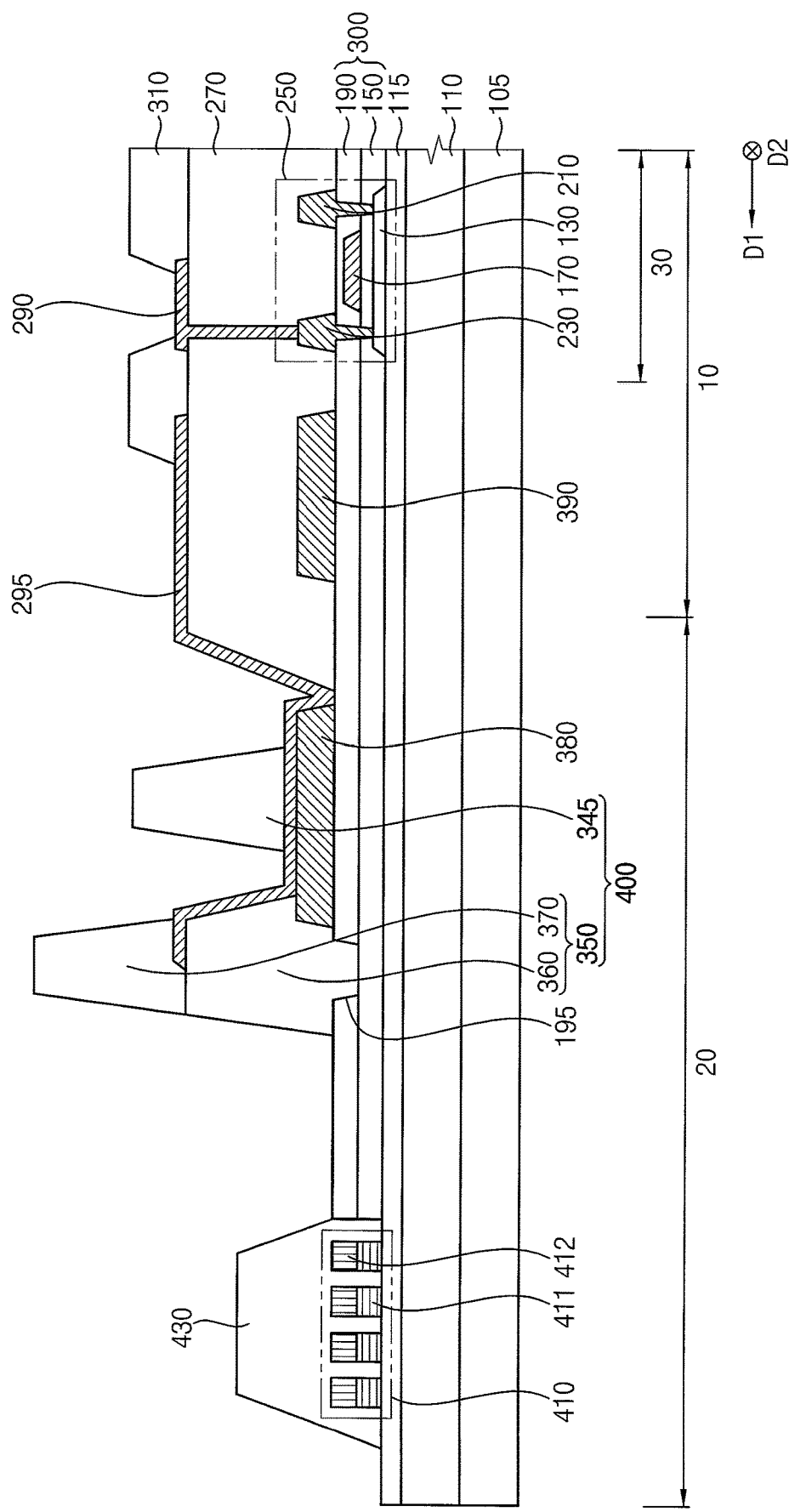
Figure 7:
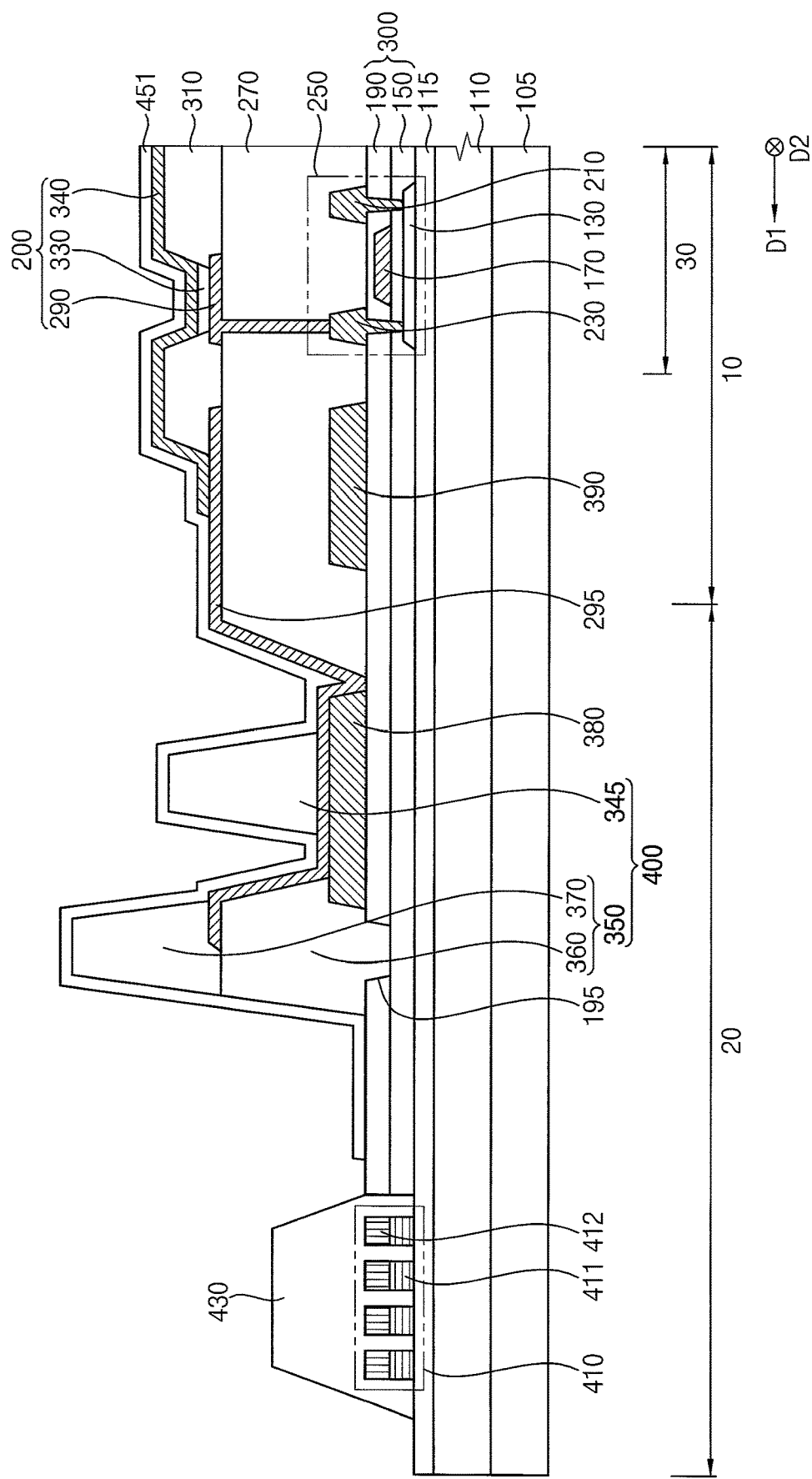

Referring to FIG. 4, an insulating layer structure 300, including a gate insulation layer 150 and an insulating interlayer 190 and a shock absorbing structure 410 including first concave and convex patterns 411 and second concave and convex patterns 412, may be formed by selectively etching the preliminary gate insulation layer 1150 and the preliminary insulating interlayer 1190. For example, a first contact hole exposing a first side (e.g., a source region) of the active layer 130 and a second contact hole exposing a second side (e.g., a drain region) of the active layer 130 may be formed in the pixel region 30, and an opening 195, which exposes an upper surface of the gate insulation layer 150, of the insulating interlayer 190 may be formed in the peripheral region 20. The first concave and convex patterns 411 and the second concave and convex patterns 412 may be formed in the outermost portion of the peripheral region 20 on the buffer layer 115.

The shock absorbing structure 410 may be spaced apart from the insulating layer structure 300 in the first direction D1, and the shock absorbing structure 410 and the insulating layer structure 300 may be located within the same layer. In addition, the first concave and convex patterns 411 may be formed on the buffer layer 115, and may be spaced apart from each other. The second concave and convex patterns 412 may be formed on the first concave and convex patterns 411, and may at least partially overlap the first concave and convex patterns 411. Here, the first concave and convex patterns 411 and the gate insulation layer 150 may be located within the same layer, and the second concave and convex patterns 412 and the insulating interlayer 190 may be located within the same layer. The shock absorbing structure 410 and the insulating layer structure 300 may be simultaneously formed from substantially the same materials.

A source electrode 210 and a drain electrode 230 may be formed in the pixel region 30 on the insulating interlayer 190. The source electrode 210 may be in contact with a source region of the active layer 130 via a first contact hole formed by removing a first portion of the gate insulation layer 150 and the insulating interlayer 190. The drain electrode 230 may be in contact with a drain region of the active layer 130 via a second contact hole formed by removing a second portion of the gate insulation layer 150 and the insulating interlayer 190. Each of the source electrode 210 and the drain electrode 230 may be formed from a metal, an alloy, metal nitride, conductive metal oxide, transparent conductive materials, etc. These may be used alone or in a suitable combination thereof. Alternatively, each of the source electrode 210 and the drain electrode 230 may have a multi-layered structure including a plurality of layers. Accordingly, a semiconductor element 250 including the active layer 130, the gate electrode 170, the source electrode 210, and the drain electrode 230 may be formed.

A first power supply voltage wiring 380 may be formed in the peripheral region 20 on the insulating layer structure 300. In exemplary embodiments of the present disclosure, the first power supply voltage wiring 380 may be located adjacent to a boundary of the display region 10 and the peripheral region 20, and may extend in a second direction D2 that is perpendicular to the first direction D1. In addition, the first power supply voltage wiring 380 might not overlap the opening 195 of the insulating interlayer 190, and a low power supply voltage may be provided in the first power supply voltage wiring 380. For example, the first power supply voltage wiring 380 may be formed from a metal, an alloy of a metal, metal nitride, conductive metal oxide, transparent conductive materials, etc. These may be used alone or in a suitable combination thereof. Alternatively, the first power supply voltage wiring 380 may have a multi-layered structure including a plurality of layers.

A second power supply voltage wiring 390 may be formed in the display region 10 on the insulating layer structure 300. In exemplary embodiments of the present disclosure, the second power supply voltage wiring 390 may be located adjacent to a boundary of the display region 10 and the peripheral region 20, and may be formed between the first power supply voltage wiring 380 and the drain electrode 230 on the insulating layer structure 300. In addition, the second power supply voltage wiring 390 may extend in the second direction D2, and a high power supply voltage, which has a relatively high voltage level than the low power supply voltage, may be provided in the second power supply voltage wiring 390. For example, the second power supply voltage wiring 390 may be formed from a metal, an alloy of a metal, metal nitride, conductive metal oxide, transparent conductive materials, etc. These may be used alone or in a suitable combination thereof. Alternatively, the second power supply voltage wiring 390 may have a multi-layered structure including a plurality of layers.

In exemplary embodiments of the present disclosure, the first power supply voltage wiring 380, the second power supply voltage wiring 390, the source electrode 210, and the drain electrode 230 may be located within the same layer, and may be simultaneously formed from substantially the same materials. For example, after a preliminary electrode layer is formed over the entire insulating layer structure 300, the first power supply voltage wiring 380, the second power supply voltage wiring 390, the source electrode 210, and the drain electrode 230 may be simultaneously formed by selectively etching the preliminary electrode layer.

A planarization layer 270 may be formed on the insulating layer structure 300, the second power supply voltage wiring 390, the source electrode 210, and the drain electrode 230, and might not overlap the first power supply voltage wiring 380. The planarization layer 270 may be formed with a thickness sufficient to cover the second power supply voltage wiring 390 and the source and drain electrodes 210 and 230 on the insulating interlayer 190. In this case, the planarization layer 270 may have a substantially flat upper surface, and a planarization process may be further performed on the planarization layer 270 to implement the flat upper surface of the planarization layer 270. In addition, the planarization layer 270 may have a contact hole exposing an upper surface of the drain electrode 230. The planarization layer 270 may include organic materials or inorganic materials. In exemplary embodiments of the present disclosure, the planarization layer 270 may be formed from organic materials.

A first sub-block pattern 360 may be formed in the peripheral region 20 on the insulating layer structure 300. In exemplary embodiments of the present disclosure, the first sub-block pattern 360 may at least partially fill the opening 195 of the insulating interlayer 190, and may be in direct contact with an upper surface of the gate insulation layer 150. The first sub-block pattern 360 may at least partially overlap a portion of the first power supply voltage wiring 380. In addition, the first sub-block pattern 360 and the planarization layer 270 may be located within the same layer. The first sub-block pattern 360 may include organic materials or inorganic materials. In exemplary embodiments of the present disclosure, the first sub-block pattern 360 may be formed from the organic materials such as polyimide, epoxy-based resin, acryl-based resin, polyester, photoresist, polyacryl-based resin, polyimide-based resin, a polyamide-based resin, a siloxane-based resin, etc.

A protective insulation layer 430 may be formed in the peripheral region 20 on the buffer layer 115 and the shock absorbing structure 410. The protective insulation layer 430 may at least partially overlap and cover the shock absorbing structure 410. In exemplary embodiments of the present disclosure, the protective insulation layer 430 may completely cover the shock absorbing structure 410. The protective insulation layer 430 may be formed from organic materials, and the planarization layer 270, the first sub-block pattern 360, and the protective insulation layer 430 may be simultaneously formed from substantially the same materials. For example, after an organic layer is formed over the entire insulating layer structure 300, the organic layer may be partially removed using a silt mask, a halftone mask, a halftone silt mask, etc., and then the planarization layer 270, the first sub-block pattern 360, and the protective insulation layer 430 may be simultaneously formed.

A lower electrode 290 may be formed in the pixel region 30 on the planarization layer 270. The lower electrode 290 may be in direct contact with the drain electrode 230 via the contact hole of the planarization layer 270, and may be electrically connected to the semiconductor element 250. The lower electrode 290 may be formed from a metal, a metal alloy, metal nitride, conductive metal oxide, transparent conductive materials, etc. These may be used alone or in a suitable combination thereof. Alternatively, the lower electrode 290 may have a multi-layered structure including a plurality of layers.

A connection pattern 295 may be formed on the planarization layer 270, the first power supply voltage wiring 380, and a portion of an upper surface of the first sub-block pattern 360. For example, the connection pattern 295 may be spaced apart from the lower electrode 290 on the planarization layer 270, and may extend in the first direction D1. The connection pattern 295 may be formed in the display and peripheral regions 10 and 20, which are located adjacent to a boundary the display region 10 and the peripheral region 20, on the planarization layer 270. The connection pattern 295 may be formed from a metal, an alloy of a metal, metal nitride, conductive metal oxide, transparent conductive materials, etc. These may be used alone or in a suitable combination thereof. Alternatively, the connection pattern 295 may have a multi-layered structure including a plurality of layers. In exemplary embodiments of the present disclosure, the lower electrode 290 and the connection pattern 295 may be simultaneously formed from substantially the same materials. For example, after a preliminary electrode layer is formed over the entire substrate 110, the lower electrode 290 and the connection pattern 295 may be simultaneously formed by selectively etching the preliminary electrode layer.

A pixel defining layer 310 may be formed on a portion of the lower electrode 290, a portion of the connection pattern 295, and the planarization layer 270. The pixel defining layer 310 may at least partially cover both lateral portions of the lower electrode 290, and may have an opening exposing a portion of an upper surface of the lower electrode 290. The pixel defining layer 310 may include organic materials or inorganic materials. In exemplary embodiments of the present disclosure, the pixel defining layer 310 may be formed from the organic materials.

A first block pattern 345 may be formed in the peripheral region 20 on the connection pattern 295. For example, the first block pattern 345 may be formed on the connection pattern 295 under which the first power supply voltage wiring 380 is located. As illustrated in FIG. 1, the first block pattern 345 may surround the display region 10. The first block pattern 345 may include inorganic materials or organic materials. In exemplary embodiments of the present disclosure, the first block pattern 345 may be formed from the organic materials.

A second sub-block pattern 370 may be formed on the first sub-block pattern 360 and a portion of the connection pattern 295. In addition, the second sub-block pattern 370 may be formed from organic materials. In exemplary embodiments of the present disclosure, the pixel defining layer 310, the first block pattern 345, and the second sub-block pattern 370 may be simultaneously formed from substantially the same materials. For example, after an organic layer is formed on the planarization layer 270, the connection pattern 295, and first sub-block pattern 360, the organic layer may be partially removed using the silt mask, the halftone mask, the halftone silt mask, etc., and then the pixel defining layer 310, the first block pattern 345, and the second sub-block pattern 370 may be simultaneously formed.

Accordingly, the second block pattern 350 including the first sub-block pattern 360 and the second sub-block pattern 370 may be formed. As illustrated in FIG. 1, the second block pattern 350 may be spaced apart from the first block pattern 345 in the first direction D1, and the second block pattern 350 may surround the first block pattern 345. A height of the second block pattern 350 may be greater than a height of the first block pattern 345. In addition, the first block pattern 345 and the second block pattern 350 may be defined as the block structure 400.

A light emitting layer 330 may be formed on the lower electrode 290 exposed by the opening of the pixel defining layer 310. The light emitting layer 330 may be formed from light emitting materials capable of generating different colors of light (e.g., red, blue, and green, etc.) according to sub-pixels. Alternatively, the light emitting layer 330 may generate white light by stacking a plurality of light emitting materials capable of generating different colors such as red, green, blue, etc. In this case, a color filter may be formed on the light emitting layer 330. The color filter may include a red color filter, a green color filter, and/or a blue color filter. Alternatively, the color filter may include a yellow color filter, a cyan color filter, and/or a magenta color filter. The color filter may be formed from a photosensitive resin, etc.

An upper electrode 340 may be formed on the pixel defining layer 310 and the light emitting layer 330. The upper electrode 340 may at least partially cover the light emitting layer 330 and the pixel defining layer 310, and may be formed over the entire substrate 110. In exemplary embodiments of the present disclosure, the upper electrode 340 may at least partially cover the light emitting layer 330 and may extend in the first direction D1, and may be electrically connected to the connection pattern 295 in the display region 10 that is located adjacent to a boundary of the display region 10 and the peripheral region 20. The upper electrode 340 may be formed from a metal, a metal alloy, metal nitride, conductive metal oxide, transparent conductive materials, etc. These may be used alone or in a suitable combination thereof. Alternatively, the upper electrode 340 may have a multi-layered structure including a plurality of layers. Accordingly, a pixel structure 200 including the lower electrode 290, the light emitting layer 330, and the upper electrode 340 may be formed.

A first TFE layer 451 may be formed on the upper electrode 340, the connection pattern 295, the block structure 400, the insulating interlayer 190, etc. The first TFE layer 451 may at least partially cover the upper electrode 340, the connection pattern 295, and the block structure 400, and may be formed with a substantially uniform thickness along a profile of the upper electrode 340, the connection pattern 295, and the block structure 400. The first TFE layer 451 may prevent the permeation of moisture, water, oxygen, etc. that may deteriorate the pixel structure 200. In addition, the first TFE layer 451 may protect the pixel structure 200 from external impact. The first TFE layer 451 may be formed from flexible inorganic materials.

Figure 8:
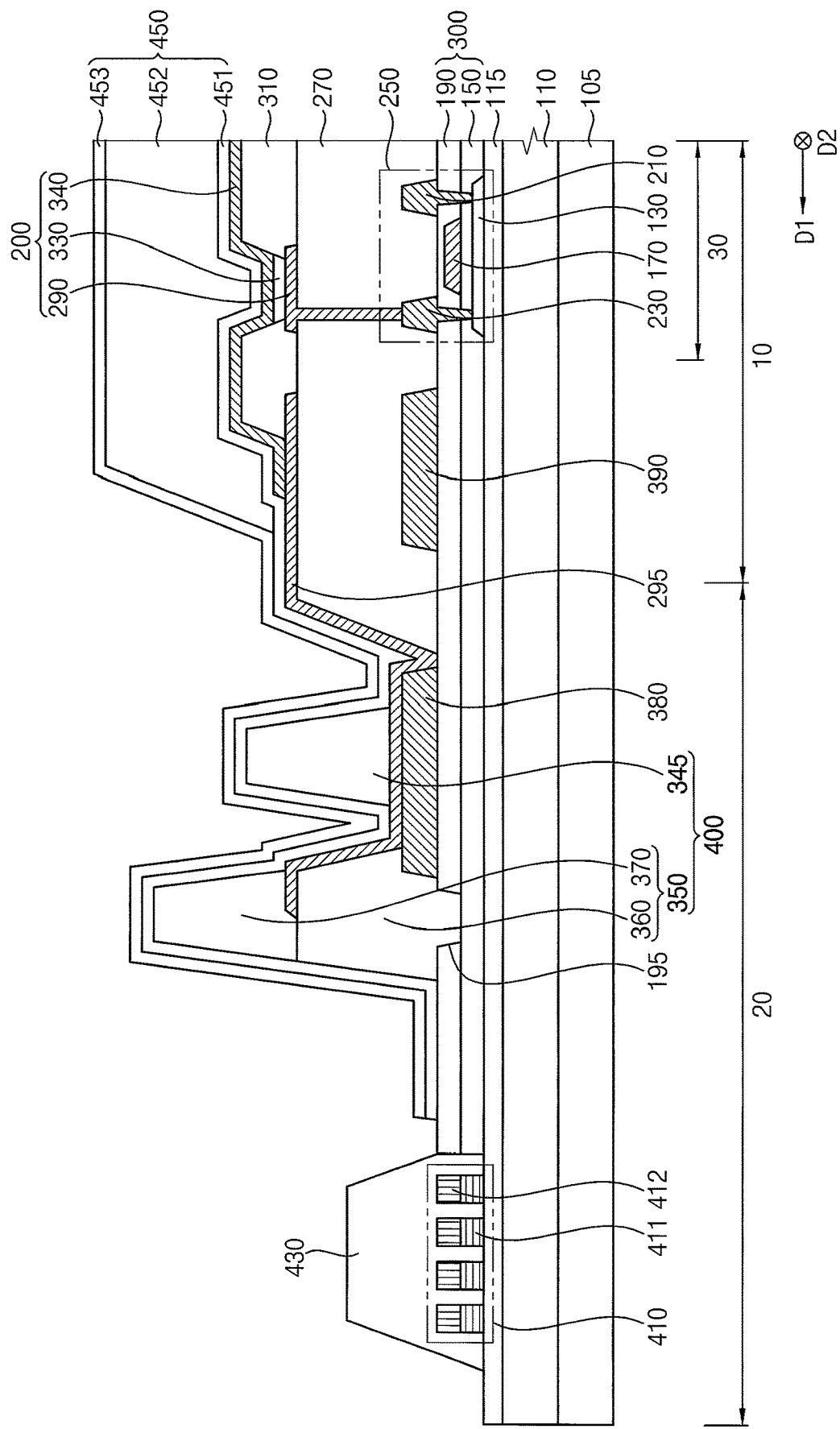

Referring to FIG. 8, a second TFE layer 452 may be formed on the first TFE layer 451. The second TFE layer 452 may increase the flatness of the OLED device 100, and may protect the pixel structure 200. The second TFE layer 452 may be formed from flexible organic materials.

A third TFE layer 453 may be formed on the second TFE layer 452. The third TFE layer 453 may at least partially cover the second TFE layer 452, and may be formed with a substantially uniform thickness along a profile of the second TFE layer 452. The third TFE layer 453 together with the first TFE layer 451 and the second TFE layer 452 may prevent the pixel structure 200 from being deteriorated by the permeation of moisture, water, oxygen, etc. In addition, the third TFE layer 453 together with the first TFE layer 451 and the second TFE layer 452 may protect the pixel structure 200 from external impact. The third TFE layer 453 may be formed from flexible inorganic materials. Accordingly, a TFE structure 450 including the first TFE layer 451, the second TFE layer 452, and the third TFE layer 453 may be formed.

Alternatively, the TFE structure 450 may have five layers structure where first through fifth TFE layers are stacked or seven layers structure where the first through seventh TFE layers are stacked.

After the TFE structure 450 is formed, the rigid glass substrate 105 may be separated from the substrate 110. Accordingly, an OLED device 100 illustrated in FIG. 1 may be manufactured.

Figure 9:
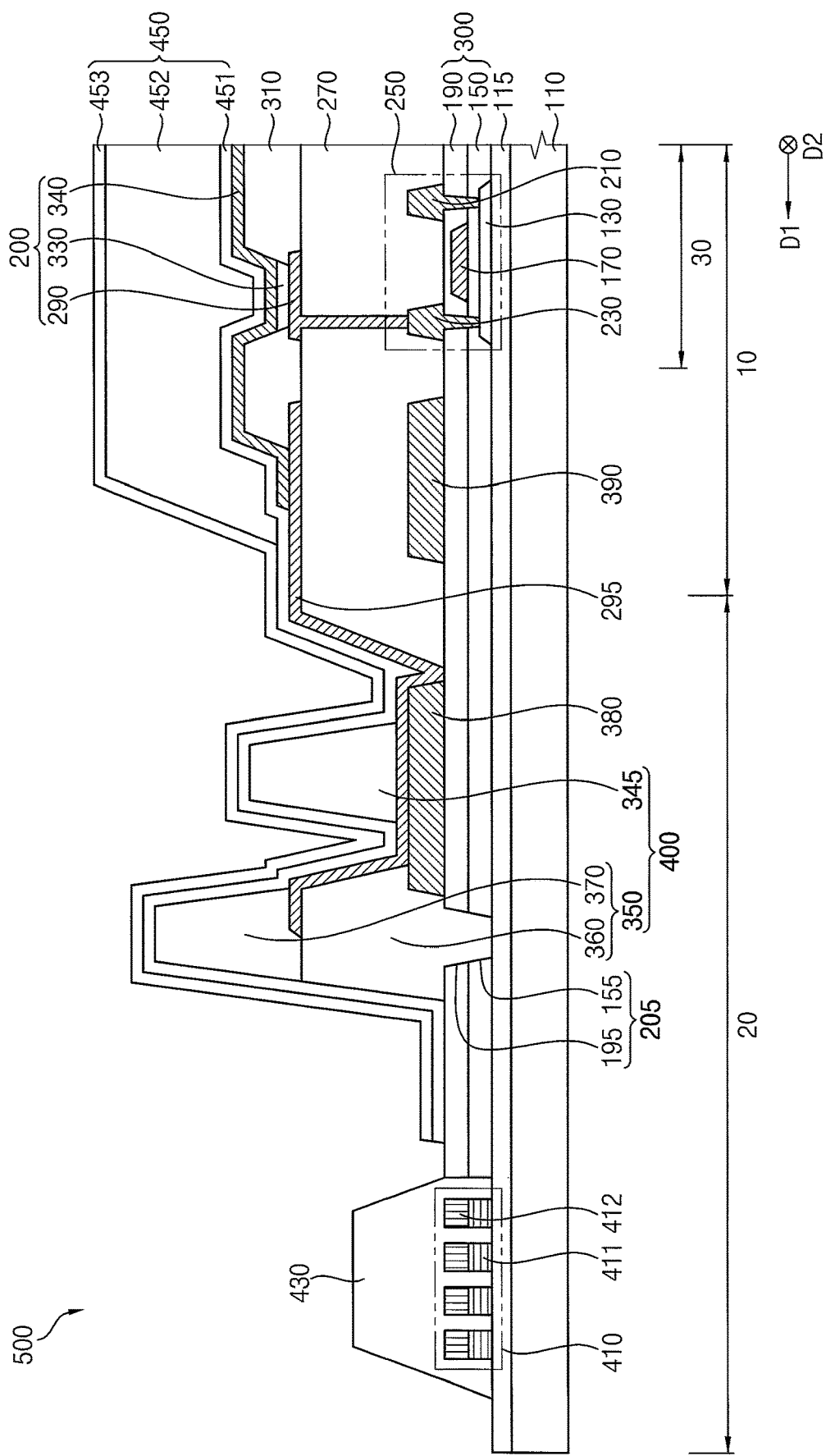
FIG. 9 is a cross-sectional view illustrating an OLED device in accordance with exemplary embodiments of the present disclosure.
Figure 10:
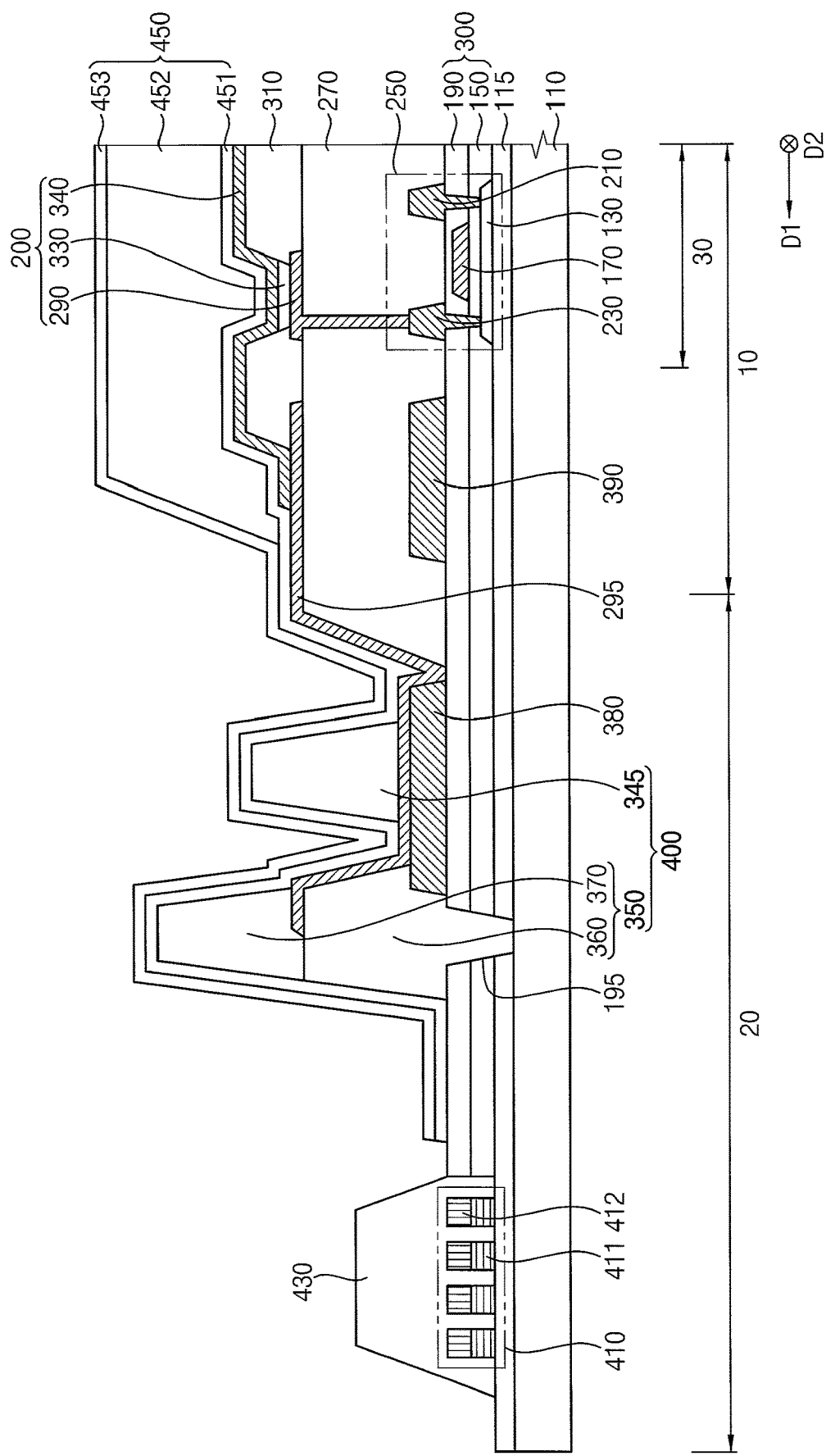
FIG. 10 is a cross-sectional view illustrating an OLED device in accordance with exemplary embodiments of the present disclosure.

FIG. 9 is a cross-sectional view illustrating an OLED device in accordance with exemplary embodiments of the present disclosure, and FIG. 10 is a cross-sectional view illustrating an OLED device in accordance with exemplary embodiments of the present disclosure. An OLED device 500 illustrated in FIG. 9 may have a configuration substantially the same as or similar to that of an OLED device 100 described with reference to FIGS. 1 and 2 except for a shape of the first sub-block pattern 360. In reference to FIG. 9, omitted details may be understood to be at least similar to the details of corresponding elements described above with reference to FIGS. 1 and 2.

Referring to FIG. 9, an OLED device 500 may include a substrate 110, a buffer layer 115, a semiconductor element 250, an insulating layer structure 300, a shock absorbing structure 410, a first power supply voltage wiring 380, a second power supply voltage wiring 390, a planarization layer 270, a protective insulation layer 430, a block structure 400, a pixel structure 200, a connection pattern 295, a pixel defining layer 310, a TFE structure 450, etc. Here, the insulating layer structure 300 may include a gate insulation layer 150 and an insulating interlayer 190, and the block structure 400 may include a first block pattern 345 and a second block pattern 350. Here, the second block pattern 350 may include a first sub-block pattern 360 and a second sub-block pattern 370.

In exemplary embodiments of the present disclosure, the insulating layer structure 300 may have an opening 205 in the peripheral region 20. The opening 205 may at least partially overlap the first sub-block pattern 360. For example, the gate insulation layer 150 may have a first opening 155 exposing an upper surface of the buffer layer 115 in the peripheral region 20, and the insulating interlayer 190 may have a second opening 195 at least partially overlapping the first opening 155. Here, the first opening 155 and the second opening 195 may be defined as the opening 205 of the insulating layer structure 300.

The first sub-block pattern 360 may be disposed in the peripheral region 20 on the insulating layer structure 300. In exemplary embodiments of the present disclosure, the first sub-block pattern 360 may at least partially fill the opening 205 of the insulating layer structure 300, and may be in direct contact with an upper surface of the buffer layer 115. The first sub-block pattern 360 may at least partially overlap a portion of the first power supply voltage wiring 380. In addition, the first sub-block pattern 360 may block a leakage of the second TFE layer 452, and the first sub-block pattern 360 and the planarization layer 270 may be located within the same layer. The first sub-block pattern 360 may include organic materials or inorganic materials. In exemplary embodiments of the present disclosure, the first sub-block pattern 360 may include the organic materials.

In exemplary embodiments of the present disclosure, as the insulating layer structure 300 includes the opening 205 (e.g., the first opening 155 of the gate insulation layer 150 and the second opening 195 of the insulating interlayer 190), a contact area of the second block pattern 350 may be relatively increased by the opening 205. Accordingly, although a width of the second block pattern 350 is relatively reduced, a contact failure where the second block pattern 350 is separated from the insulating layer structure 300 may be prevented.

In some exemplary embodiments of the present disclosure, as illustrated in FIG. 10, the buffer layer 115 and the insulating layer structure 300 may have an opening 195, and the first sub-block pattern 360 may at least partially fill the opening 195. In this case, the first sub-block pattern 360 may be in direct contact with an upper surface of the substrate 110.

Figure 11:
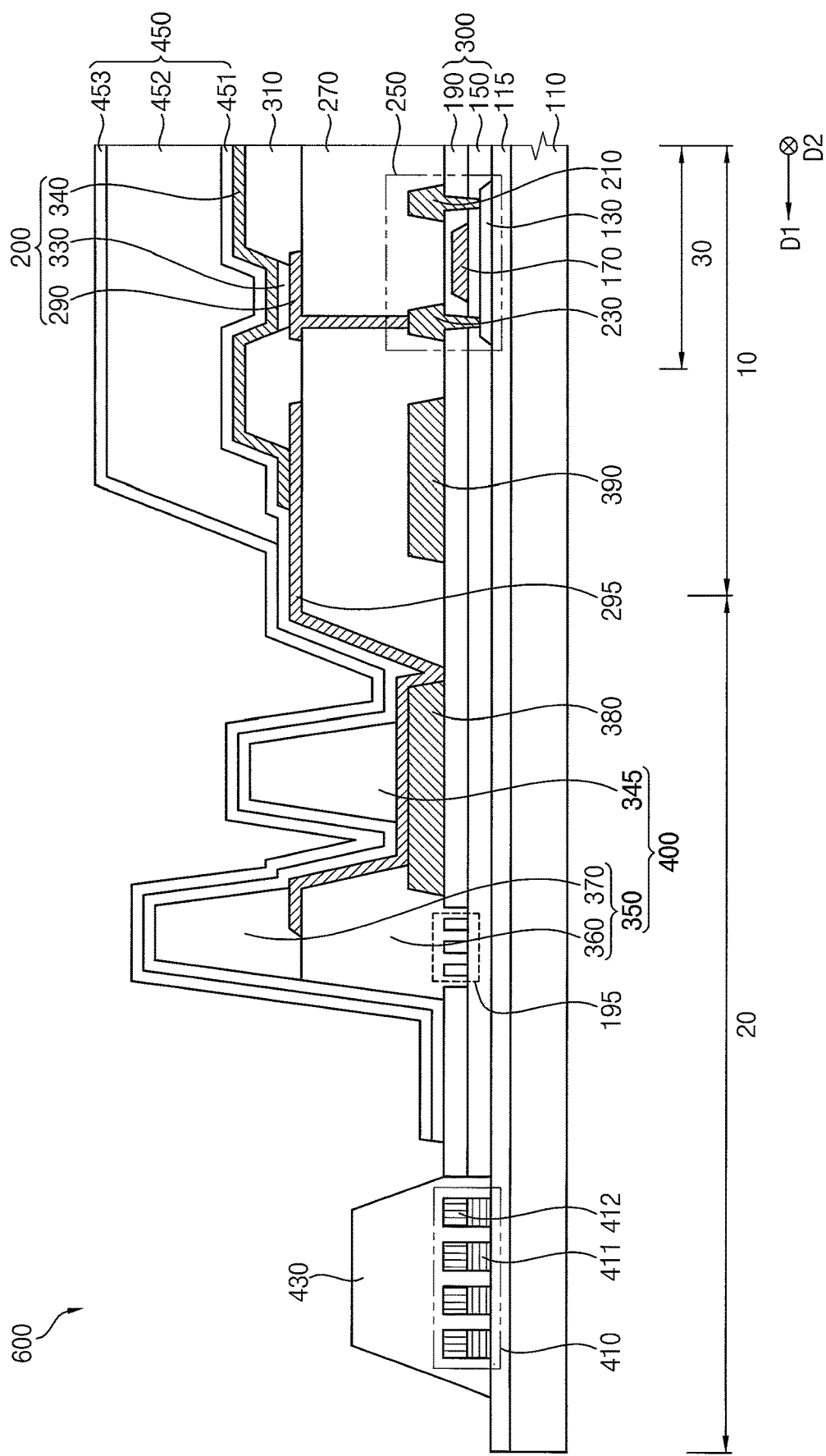
FIG. 11 is a cross-sectional view illustrating an OLED device in accordance with exemplary embodiments of the present disclosure.

FIG. 11 is a cross-sectional view illustrating an OLED device in accordance with exemplary embodiments of the present disclosure. An OLED device 600 illustrated in FIG. 11 may have a configuration substantially the same as or similar to that of an OLED device 100 described with reference to FIGS. 1 and 2 except for a shape of the first sub-block pattern 360. In reference to FIG. 11, omitted details may be understood to be at least similar to the details of corresponding elements described above with reference to FIGS. 1 and 2.

Referring to FIG. 11, an OLED device 600 may include a substrate 110, a buffer layer 115, a semiconductor element 250, an insulating layer structure 300, a shock absorbing structure 410, a first power supply voltage wiring 380, a second power supply voltage wiring 390, a planarization layer 270, a protective insulation layer 430, a block structure 400, a pixel structure 200, a connection pattern 295, a pixel defining layer 310, a TFE structure 450, etc. Here, the insulating layer structure 300 may include a gate insulation layer 150 and an insulating interlayer 190, and the block structure 400 may include a first block pattern 345 and a second block pattern 350. Here, the second block pattern 350 may include a first sub-block pattern 360 and a second sub-block pattern 370.

In exemplary embodiments of the present disclosure, the insulating layer structure 300 may have a plurality of grooves 195 in the peripheral region 20. The grooves 195 may at least partially overlap the first sub-block pattern 360. For example, the insulating interlayer 190 may have a plurality of openings, and the openings may expose an upper surface of the gate insulation layer 150. Here, the plurality of openings may be defined as the grooves 195 of the insulating layer structure 300.

The first sub-block pattern 360 may be disposed in the peripheral region 20 on the insulating layer structure 300. In exemplary embodiments of the present disclosure, the first sub-block pattern 360 may at least partially fill the grooves 195 of the insulating layer structure 300, and may be in direct contact with an upper surface of the gate insulation layer 150. The first sub-block pattern 360 may at least partially overlap a portion of the first power supply voltage wiring 380. In addition, the first sub-block pattern 360 may block a leakage of the second TFE layer 452, and the first sub-block pattern 360 and the planarization layer 270 may be located within the same layer. The first sub-block pattern 360 may include organic materials or inorganic materials. In exemplary embodiments of the present disclosure, the first sub-block pattern 360 may include the organic materials.

The present invention may be applied to various display devices including an OLED device. For example, the present invention may be applied to vehicle-display device, a ship-display device, an aircraft-display device, portable communication devices, display devices for display or for information transfer, a medical-display device, etc.

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. An organic light emitting display (OLED) device, comprising:
    a substrate including a display region and a peripheral region at least partially surrounding the display region;
    an insulating layer structure disposed on the substrate within both the display region and the peripheral region, the insulating layer structure including a groove in the peripheral region;
    a power supply voltage wiring disposed on the insulating layer structure in the peripheral region;
    a plurality of pixel structures disposed in the display region on the insulating layer structure; and
    a block structure disposed in the peripheral region and at least partially overlapping the groove of the insulating layer structure, the block structure at least partially filling the groove of the insulating layer structure, the block structure at least partially overlapping the power supply voltage wiring.

2. The OLED device of claim 1, further comprising: a shock absorbing structure disposed in the peripheral region on the substrate, the shock absorbing structure being spaced apart from the block structure in a first direction, the shock absorbing structure having a plurality of concave and convex patterns.

3. The OLED device of claim 2, wherein the shock absorbing structure is disposed at an edge of the substrate.

4. The OLED device of claim 3, wherein the shock absorbing structure and the insulating layer structure are located within a same layer, and are spaced apart from each other.

5. The OLED device of claim 2, further comprising: a protective insulation layer at least partially overlapping the shock absorbing structure, the protective insulation layer at least partially covering the shock absorbing structure.

6. The OLED device of claim 2, further comprising:
a buffer layer disposed on the substrate,
wherein the insulating layer structure includes:
a gate insulation layer disposed on the buffer layer; and
an insulating interlayer disposed on the gate insulation layer.

7. The OLED device of claim 6, wherein the insulating interlayer has an opening exposing an upper surface of the gate insulation layer in the peripheral region, and wherein the groove of the insulating layer structure includes the opening.

8. The OLED device of claim 6, wherein the shock absorbing structure includes: a plurality of stacked patterns, spaced apart from one another, wherein each of the plurality of stacked patterns includes a convex pattern and a concave pattern in a stack.

9. The OLED device of claim 8, wherein the convex pattern of each of the plurality of stacked patterns are located within a same layer as either the gate insulating layer or the insulating interlayer and the concave pattern of each of the plurality of stacked patterns are located within a same layer as the other of the gate insulating layer or the insulating interlayer.

10. The OLED device of claim 1, wherein the power supply voltage wiring it adjacent to a boundary where the display region and the peripheral region meet.

11. The OLED device of claim 10, wherein the block structure includes:
a first block pattern disposed on the power supply voltage wiring; and
a second block pattern spaced apart from the first block pattern in a first direction, the second block pattern at least partially surrounding the first block pattern, and wherein the second block pattern at least partially overlaps the groove of the insulating layer structure.

12. The OLED device of claim 11, wherein a height of the second block pattern is greater than a height of the first block pattern.

13. The OLED device of claim 11, wherein the second block pattern includes:
a first sub-block pattern disposed on the insulating layer structure; and
a second sub-block pattern disposed on the first sub-block pattern.

14. The OLED device of claim 13, further comprising: a connection pattern disposed in the display and peripheral regions, and interposed between the first block pattern and the fin power supply voltage wiring in the peripheral region.

15. The OLED device of claim 14, wherein a portion of the connection pattern is interposed between the first sub-block pattern and the second sub-block pattern.

16. The OLED device of claim 14, wherein each of the plurality of pixel structures includes:
a lower electrode disposed on the substrate;
a light emitting layer disposed on the lower electrode; and
an upper electrode disposed on the light emitting layer,
wherein the upper electrode is electrically connected to the connection pattern in the display region.

17. The OLED device of claim 16, wherein the lower electrode and the connection pattern are located within a same layer.

* * * * *